United States Patent [19]

Husain

[11] Patent Number: 4,544,311
[45] Date of Patent: Oct. 1, 1985

[54] MASK ALIGNMENT APPARATUS

[75] Inventor: Anwar Husain, Mt. View, Calif.

[73] Assignee: Micronix Partners, Los Gatos, Calif.

[21] Appl. No.: 475,427

[22] Filed: Mar. 15, 1983

[51] Int. Cl.⁴ .......................... B23Q 3/06; B23B 31/10
[52] U.S. Cl. ...................... 409/224; 269/21;
            279/1 R; 279/4
[58] Field of Search .............. 269/21, 43, 287;
        409/224; 279/4, 1 R; 250/491.1; 378/34, 205;
                    356/401; 350/531; 29/564, 56.6

[56] References Cited

U.S. PATENT DOCUMENTS

| | | | |
|---|---|---|---|
| 2,250,634 | 7/1941 | Groene | 279/4 |
| 2,451,705 | 10/1948 | Adair | 279/4 |
| 3,333,274 | 7/1967 | Forcier | 269/21 |
| 3,475,097 | 10/1969 | Bishop et al. | 269/21 X |
| 3,499,640 | 3/1970 | Berz | 269/21 |
| 3,499,718 | 3/1970 | Schellenberg | 269/21 X |
| 3,711,081 | 1/1973 | Cachon | 269/21 |
| 4,410,168 | 10/1983 | Gotman | 269/21 |
| 4,428,815 | 1/1984 | Powell et al. | 269/21 X |
| 4,444,492 | 4/1984 | Lee | 269/21 X |

*Primary Examiner*—William R. Briggs
*Attorney, Agent, or Firm*—Thomas S. MacDonald; Alan H. MacPherson; Steven F. Caserza

[57] ABSTRACT

A mask aligner (10) includes a ring member (11) having an aperture (13) and a series of internal pneumatic cylinders (14-17) having rolling bearing surfaces (19) at the ends of piston rod shafts (18) wherein when a mask (20) is positioned in the aperture, one bearing surface is actuated inwardly to move the mask laterally into engagement with others of said bearing surfaces to rigidly hold and coarse align the mask. Fine accurate alignment in the x, y and φ directions are provided by a spaced series of linear motors (40, 41, 42) and a linkage (45) extending between the motor shaft (43) and a rigid post on a fixed support arm (12), the linkage being of sufficient flexibility to bend when the linear motor moves its shaft (43) inwardly to shorten the span between the motor(s) and the rigid post, and of sufficient stiffness to act as a push rod when the linear motor moves its shaft outwardly to lengthen the span between the motor(s) and the rigid post.

20 Claims, 3 Drawing Figures

MASK ALIGNMENT APPARATUS

CROSS-REFERENCES TO RELATED APPLICATIONS

This invention relates to and is useful in the X-ray lithography system shown in U.S. Patent Application Ser. No. 475,430 filed Mar. 15, 1984 now U.S. Pat. No. 4,514,858, entitled "Lithography System", by W. Thomas Novak, Inventor, and may be utilized with that invention shown in U.S. Application Ser. No. 475,420 filed Mar. 15, 1984, now U.S. Pat. No. 4,525,852, entitled "Wafer Stage Apparatus", by Lawrence M. Rosenberg, Inventor, and U.S. Application Ser. No. 475,439 filed Mar. 15, 1984 entitled "Mask Loading Apparatus Method and Cassette" by W. Thomas Novak and Peter R. Jagusch, Inventors, each filed concurrently herewith and assigned to the assignee of this application. The subject matter of each of the above-identified co-pending applications is incorporated herein by reference.

BACKGROUND OF THE INVENTION

1. Field of the Invention

This invention pertains to a compact device for holding and accurately aligning a mask used in the fabrication of integrated circuits and components on semiconductor wafer substrates. Multiple masks are employed in the semiconductor fabrication process and each must be aligned in spatial relation with the wafer on which the fabrication operations are to be performed in sequential steps. Sub-micron alignment tolerances are often required. In practice, the mask must be held and initially accurately positioned and a wafer is then moved or positioned at a series of predetermined positions so as to perform, for example, various photolithography steps by X-ray, ultraviolet or other electron or photon means on the wafer substrate.

2. Description of the Prior Art

The functions of masks in wafer fabrication processes are described in U.S. Pat. Nos. 4,037,969 and 4,326,805 where an X-ray lithographic system is disclosed particularly involving the relative alignment of mask-to-wafer including mask-to-wafer separation.

U.S. Pat. No. 4,185,202 (FIG. 4) shows a typical mask holding device in which the mask is spring mounted between a series of lower pin members and an upper overhanging element fixed to the main frame for holding the wafer and mask. Such a mask holder does not allow for accurate orientation or alignment of the mask nor does it rigidly hold the mask in fixed position relative to the wafer. The mask can be easily rotated, moved laterally, or canted and is dependent on the spring forces of the individual springs and accurate sizing of the pin elements.

SUMMARY

The mask alignment apparatus of the present invention functions to hold and adjust an inserted mask in rotative (theta) orientation as well as in the x-y axis directions utilizing a series of linear motors having a linear moving shaft flexibly connected to rigid support fingers. Means also is provided for initial coarse adjustment of the mask in the alignment apparatus. Use of the described apparatus results in the mask being held and with the capability of orienting into accurate x, y and $\theta$ positions the mask and a moving portion of the alignment apparatus.

The mask, once captured by the alignment apparatus, may not be inadvertently moved with respect to the apparatus. It may be moved with a portion of the apparatus to accurately orient the mask with respect to a wafer held on a juxtaposed wafer stage (not shown) with position resolution within about 0.1 microns. The orientation of the mask alignment apparatus and the wafer stage is more fully explained in such above recited co-pending applications. The apparatus is useful in the aforementioned photolithography processes and also may be employed in mask manufacture, inspection and repair.

DETAILED DESCRIPTION

Figure 1:
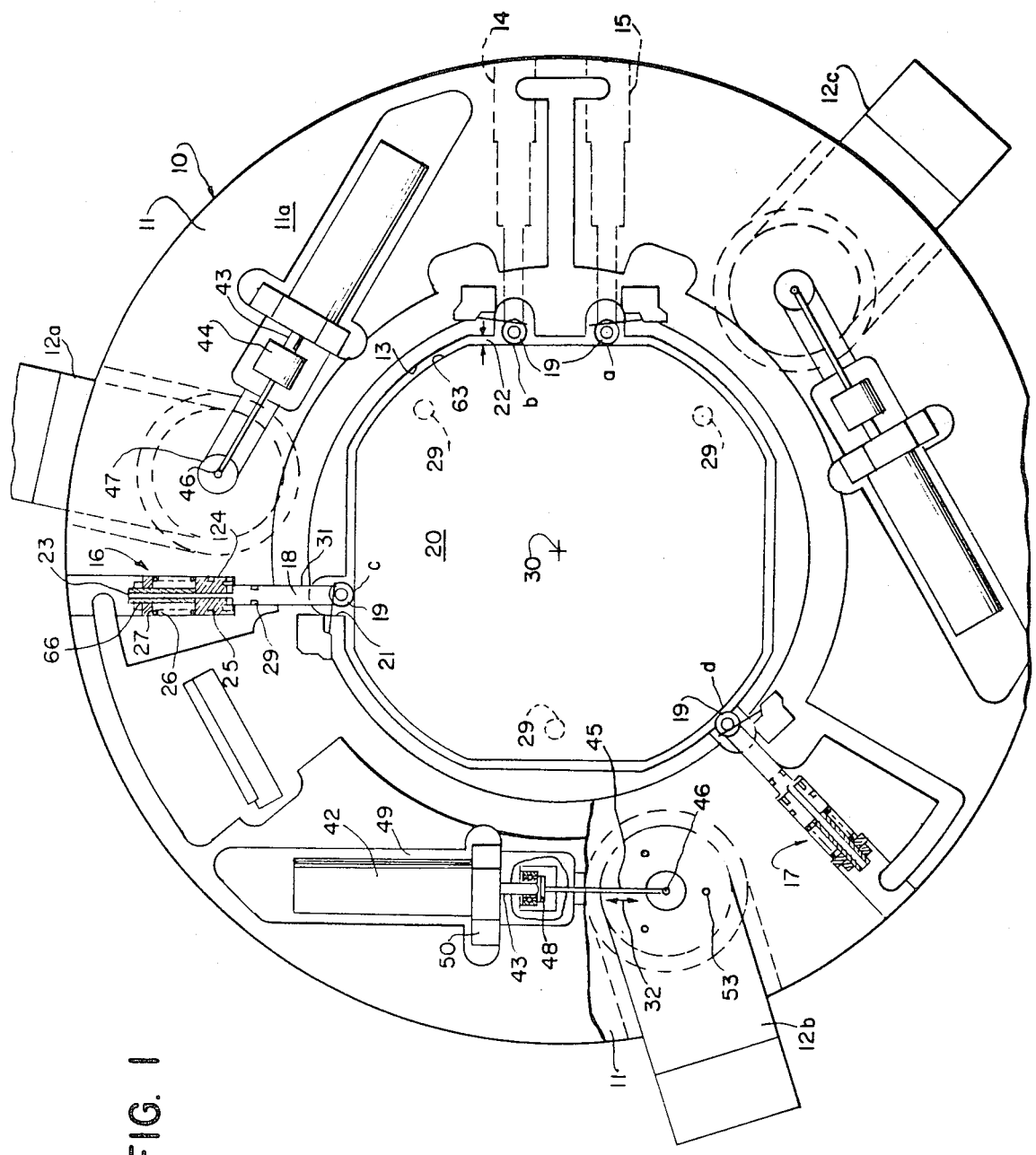
FIG. 1 is a top, partially cutaway and sectioned plan view of the alignment apparatus with its inner ring removed.

The alignment apparatus 10 comprises a substantially planar ring plate 11 which is movable in a finite arc of rotation and along x and y axis coordinates with respect to fixed support fingers 12a, 12b and 12c which are rigidly mounted to a support structure (not shown). The support structure, in the case of an X-ray lithography system may be the main support frame of the X-ray apparatus or system.

Means providing for the coarse alignment of a mask 20 within an aperture 13 of ring plate 11 is first provided. Air cylinders 14–17 are positioned around the periphery of aperture 13 extending in a direction slightly off from a radial orientation. Each of the cylinders has a linear moving shaft 18 and a vertically extending roller bearing 19 attached at the inwardly facing end of the shaft 18. The roller bearings are positioned in a U-shaped recess 21 in ring plate 11. The cylinder-shaft-roller bearing assemblies are preferably positioned so that a pair of cylinders 14 and 15 are oriented alongside and spaced from the x-axis whereby a pair of roller bearings will abut mask 20 at points a and b spaced at a position of about 10° of arc from the x-axis. A third cylinder-shaft-roller bearing assembly is positioned so that cylinder 16 is offset about 10° of arc from the far side of the y-axis away from cylinder 14 so as to be in contact with mask edge at point c. Cylinders 14, 15 and 16 are first energized to bring roller bearings into fairly close contact with the peripheral vertical outside edge 63 of mask 20. Roller bearings 19 are normally spaced a distance 22 outwardly from the inner edges of aperture 13. A fourth cylinder-shaft-roller assembly is positioned radially opposite the first three assemblies and is last energized so as to move its roller bearing against point d on the mask edge toward central axis 30 forcing points a, b and c into close rigid-holding contact with the mask edges. Mask 20 is held rigidly in ring 11 with the mask central axis in close registration with the central axis of ring 11.

Each of the cylinders 14–17 comprise a hydraulic or pneumatic entry port 23, a piston 24 movable in the cylinder casing, an O-ring seal 25 held by the piston and slidable on the casing inner walls and a return spring 26 between the top of piston 24 and a cylinder rear closure 27. A shaft O-ring seal 29 is provided which slides on the inner walls of a shaft conduit 31. The roller or other bearings are mounted for rotation on a pin (not shown) mounted on the end of shaft 18. Nut 66 can be adjusted so as to move the various shafts and roller bearings inward and outward to coarsely set the longitudinal axis 30 of the mask in the desired orientation. Once the mask has been centralized in the opening, vacuum is applied to the three vacuum cups 29 thus retaining the mask in position. The air cylinders are then retracted and the mask is supported solely by the flexurally mounted vacuum cups.

Fine adjustment of the now mounted mask is provided by a series of three small accurate linear motors 40, 41 and 42 mounted in a recess 49 in top surface 11a of ring 11. Each motor has a linear moving shaft 43 which is affixed by a coupling 44 to a first end of flexible wire 45 which has sufficient stiffness to act as a push rod. The other second end of wire 45 is fixedly connected to a rigid post 46 upstanding from a central position on each of the support fingers 12a, 12b and 12c.

Post 46 extends upwardly through a recess 47 in ring plate 11. The first end of the flexible wire is clamped into a roller bearing sleeve 48 which is bonded on the outer end of shaft 43. Linear motor 42, is mounted by bracket 50 at the bottom of the elongated recess 49. The attachment of flexible wire 45 to post 46 is thus medially of the vertical height of ring 11.

Motors 40–42 are peripherally spaced between the coarse locating pneumatic cylinders 14–17 around ring 11 at 120° spacing to each other. Movement of the shaft 43 linearly into the motor housing of motor 42, as indicated by arrow 32, for example, shortens the span distance between fixed bracket 50 and the rigid post 46 on fixed support finger 12b, thus rotating ring plate 11 counterclockwise in the shown plan view with respect to fixed finger 12b. Ring 22 is thus rotated a number of degrees of arc toward post 46, if all three motors have equal inward shaft movement. The net result is a pure rotative θ movement of ring 11 (and fixed mask 20) around axis 30. The flexible nature of wires or rods 45 allows the ring to subtend an arc which slightly changes the angularity of wire 45 with post 46 to rotatively adjust ring 11 (and the mask 20 affixed thereto). The amounts of shortening and pulling of ring 11 toward post 46 is limited by the spacing 51 between holes 47 and pins 46.

The wire or rod 45 acts as a push rod to move the ring in a clockwise direction in the plan view shown in FIG. 1 when shaft 43 of each motor is run linearly outwardly from bracket 50. This outward movement pushes ring 11 in a clockwise direction away from fixed fingers 12.

If linear motors 40, 41 and 42 are separately operated in one linear direction, or operated in groups of two in one linear direction, e.g., "in", and if the other opposed motor(s) are operated in the opposite linear direction, i.e., "out", the result is movement of the ring 11 (and wafer 20) in the x or y axis directions or in a direction representing a combination of x and y coordinates so that the central axis 30 (or any other particular point on the mask) can be accurately positioned on the x and y coordinates. The "in" and "out" movements of the motors is normally automatically controlled by suitable computer means in a microprocessor.

Figure 2:
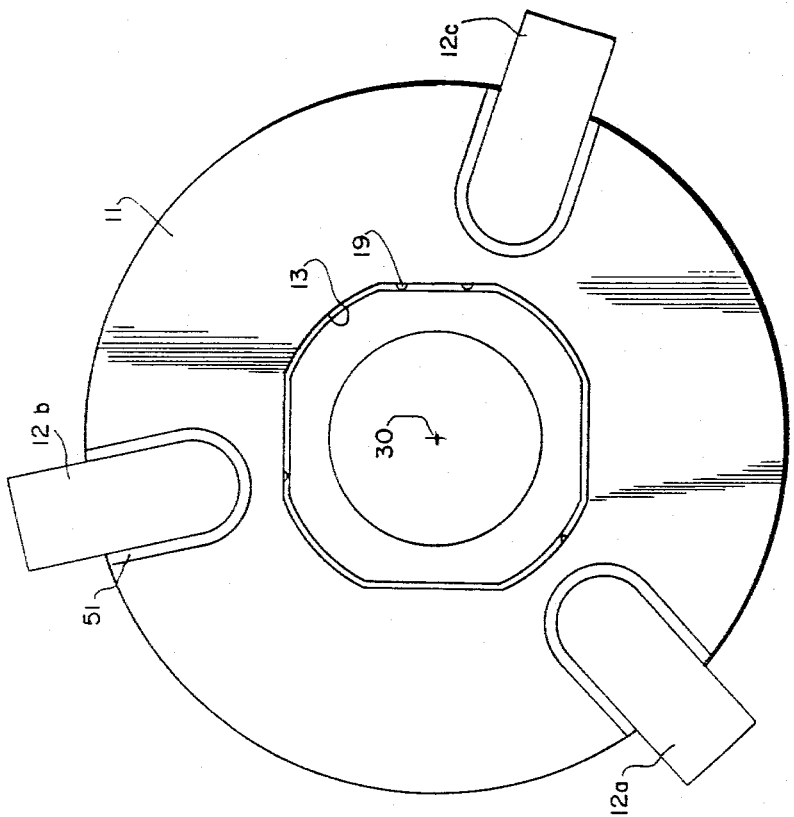
FIG. 2 is a bottom plan view of the apparatus of FIG. 1.

FIG. 2 shows the bottom underside of the mask alignment apparatus. The orientation of mask 20 held in aperture 13 of a ring plate 11 is seen. Roller bearings 19 align the mask peripheral edges. Ring 11 is rotatively and linearly movable with respect to fixed support fingers 12a, 12b and 12c.

Figure 3:
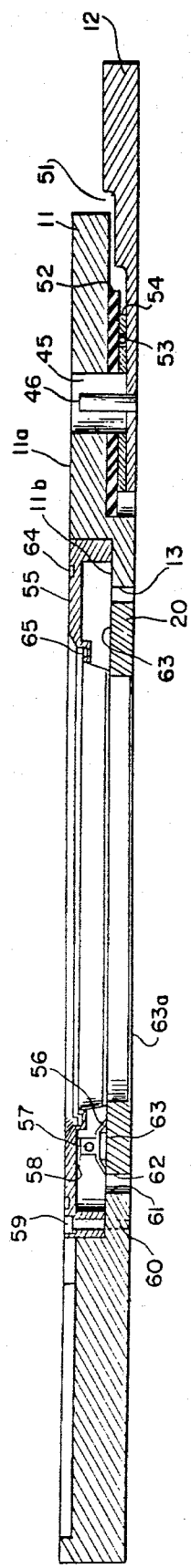
FIG. 3 is a partial cross-sectional view of the mask holding and bearing means for alignment apparatus movement taken on the line 3—3 of FIG. 2.

FIG. 3 is a cross-sectional view of the mask alignment apparatus. It is to be noted that the entire mask holding and mask positioning means are in a flat overall structure having a thickness in a preferred embodiment of only one inch. The lateral dimension is approximately 13 inches. A mask-holding inner ring 55 is mounted on an inwardly-facing flat ledge 11b extending below top surface 11a. Screws 59 mount the periphery of inner ring 55 to threaded apertures 60 in ledge 11b. A vacuum cup 56 is mounted by flexure 58 to the underside of ring 55. The vacuum cup is mounted to permit distortion free retention of the mask and to permit vertical motion of the mask during gap setting and planarization without any change in its X-ray locations. The flexure is a thin flat strip of beryllium copper, one end of which is affixed to the mask-holding inner ring 55. The other end has the vacuum cup attached to it. A vacuum inlet 57 is provided so that a vacuum can be drawn inside cup 56 to fixedly and flexibly hold mask upper peripheral edge 63 in the alignment apparatus. The peripheral outer edge 63 of the mask 20 is recessed and spaced within the reentrant recess 61 between the inner extremity of ledge 11b, the underside of inner ring 55 and the mask upper edge 62 and peripheral edge 63. The operating portion of the mask is contained on a membrane 63a stretched across edges 63.

Plate ring 11 bears on a circular bearing pad 52 surrounding the recess 47 in which post 46 upstands. A series of ball bearings 53, in a plastic bearing retainer 54 acts as a thrust bearing to support, rotate, and move plate 11 with respect to fixed fingers 12.

In operation, a mask is positioned by a suitable transport means shown in the aforesaid Novak et al. copending application, to a position below aperture 13. Mask 20 is then raised toward vacuum cups which are three in number, equally spaced around inner plate 55 to mount the mask lateral edge 63 of the mask at three equally spaced locations. Imposition of a vacuum in cups 56 hold the mask in horizontal position.

Means, including upstanding spacing members, are provided on a wafer-holding stage to space the mask from a wafer placed below the aligner. The spacing members can assure a set spacing, say 40 microns, between the wafer and mask. Small misalignment or canting of the aligner is compensated for by the up and down movement of the flexure 58 mounting the vacuum cups 56.

Means may be provided for sensing diminishing or lost vacuum in cups 56 due to loss of utilities e.g. vacuum, and for resultant automatic movement inwardly of the shafts of pneumatic or hydraulic cylinders 14–17 to recapture the edges of the mask and preventing in a fail-safe manner the mask from falling out the aligner-holder. Details of such fail-safe arrangement will be apparent to one skilled in the art.

The ring plate and support arms are made of a stable cast iron material. Flexures are made of Be Cu material.

The above description of embodiments of this invention is intended to be illustrative and not limiting. Other embodiments of this invention will be obvious to those skilled in the art in view of the above disclosure.

I claim:

1. A mask alignment apparatus comprising an annular member having an aperture for mounting a mask thereacross;

means for mounting a mask within said aperture;

a fixed support means; and alignment means for moving said member with respect to said support means in x-axis and y-axis coordinates and in rotative directions, said alignment means including linear motor means having a linearly moving shaft, said motor means being attached to said member and a flexible linkage between said shaft and said fixed support means, such that movement of said shaft moves said member with respect to said fixed support means to spacially position said mask.

2. A mask alignment apparatus comprising a member having an aperture for mounting a mask thereacross;

a fixed support means; and alignment means for aligning said member with respect to said support means, said alignment means including a linear motor means having a linearly moving shaft, said motor means being attached to said member and a flexible linkage between said shaft and said fixed support means, such that movement of said shaft moves said member with respect to said fixed support means to spacially position said mask and in which said fixed support means comprises spaced supports having an upstanding rigid post extending therefrom, said flexible linkage comprising a flexible wire extending from said shaft to said post.

3. The invention of claim 1 further including means for holding and coarse aligning said mask in said aperture.

4. A mask alignment apparatus comprising a member having an aperture for mounting a mask thereacross;

a fixed support means;

alignment means for aligning said member with respect to said support means, said alignment means including a linear motor means having a linearly moving shaft, said motor means being attached to said member and a flexible linkage between said shaft and said fixed support means, such that movement of said shaft moves said member with respect to said fixed support means to spacially position said mask; and means for holding and coarse aligning said mask in said aperture in which said coarse aligning means comprises first cylinder means mounted on said member and including a linearly operable rod shaft containing a bearing surface on its end, said surface extending inwardly into said aperture and a second cylinder means mounted on said member and including a linearly operable shaft containing a bearing surface at its end extending inwardly into said aperture, said second cylinder means and bearing surface being disposed opposite from said first cylinder means and bearing surface whereby inward actuation of said second bearing seats a mounted mask against said first and second rolling bearing surfaces.

5. The invention of claim 4 in which said first cylinder means comprises at least two spaced bearing surfaces spaced on an opposite side of aperture from said second pneumatic cylinder means.

6. The invention of claim 4 further including vacuum cup means for detachably mounting a mask to said member and means to retract said bearing surfaces from said mask.

7. The invention of claim 6 further including means to sense loss of vacuum in said cup means and to energize said first and second cylinder means and move the bearing surfaces into contact with and to hold said wafer.

8. The invention of claim 5 in which said second cylinder means is disposed 180° opposite the bisection of the radial angle between two of said two spaced bearing surfaces of said first cylinder means.

9. A mask alignment apparatus comprising a member having an aperture for mounting a mask thereacross;

a fixed support means; and alignment means for aligning said member with respect to said support means, said alignment means including a linear motor means having a linearly moving shaft, said motor means being attached to said member and a flexible linkage between said shaft and said fixed support means, such that movement of said shaft moves said member with respect to said fixed support means to spacially position said mask, in which said linear motor means is positioned substantially tangentially to an inner periphery of said ring member and said fixed support means extends into a portion of said member and wherein a bearing portion is aligned with the operating moving shafts of said linear motor means and positioned between said member and said fixed support means and wherein a rigid post upstands from said fixed support means, extends through said bearing portions and is connected to said flexible linkage.

10. The invention of claim 1 in which said flexible linkage has sufficient stiffness so as to act as a push rod when said linear motor means moves said shaft outwardly towards said fixed support means to lengthen the span between the motor means and said fixed support means.

11. The invention of claim 1 in which said flexible linkage has sufficient flexibility so as to act to flexibly articulate when said linear motor means moves said shaft inwardly to shorten the span between the said motor means and said fixed support means.

12. A mask alignment apparatus comprising a member having an aperture for mounting a mask thereacross;

a fixed support means; and alignment means for aligning said member with respect to said support means, said alignment means including a linear motor means having a linearly moving shaft, said motor means being attached to said member and a flexible linkage between said shaft and said fixed support means, such that movement of said shaft moves said member with respect to said fixed support means to spacially position said mask; in which said alignment means is positioned internally of said member and said linear motor means is operable to rotatively orient said member with respect to said fixed support means and to move said member in x and y coordinates with respect to said fixed support means.

13. The invention of claim 1 further comprising means for detachably mounting a mask to said member.

14. A mask alignment apparatus comprising a member having an aperture for mounting a mask thereacross;

a fixed support means;

alignment means for aligning said member with respect to said support means, said alignment means including a linear motor means having a linearly moving shaft, said motor means being attached to said member and a flexible linkage between said shaft and said fixed support means, such that movement of said shaft moves said member with respect to said fixed support means to spacially position said mask; and means for detachably mounting a mask to said member, said means for detachably mounting comprises spaced vacuum cups.

15. The invention of claim 14 wherein said vacuum cups are flexurally mounted.

16. A mask alignment apparatus comprising an annular member having an aperture for mounting a mask thereacross;

means for holding and coarse aligning said mask in said aperture;

a fixed support means;

means for flexually mounting said mask in said aperture relative to said member; and alignment means for moving said member with respect to said support means in X-axis and y-axis coordinates and rotative directions, said alignment means including motor means attached to said member such that operation of said motor means moves said member with respect to said fixed support means to spacially position said mask in x-axis, y-axis and rotative positions.

17. The invention of claim 16 in which said motor means includes a linear moving shaft and a push-pull linkage between said shaft and said fixed support means.

18. The invention of claim 16 including means for retracting said means for holding and coarse aligning such that said mask is solely supported by said means for flexually mounting said mask.

19. The invention of claim 16 in which said means for flexually mounting said mask comprises spaced vacuum cups.

20. The invention of claim 16 in which said means for holding and coarse aligning includes a plurality of linearly-movable, inwardly-extending shafts for abutting spaced peripheral edge portions of the mounted mask, such that movement of said shafts coarsely aligns said mask in a desired spacial position in said aperture; and in which said alignment means includes a plurality of linearly-movable shafts and flexible linkages connecting said shafts to said fixed support means, said shafts and linkages being spaced peripherally around said annular member and between adjacent ones of sad inwardly-extending shafts of said means for holding and coarse aligning.

* * * * *